Nov. 21, 1967

E. D. BRANDT ET AL 3,354,260

THROUGH-CONNECTORS FOR CIRCUIT BOARDS AND METHOD OF APPLYING SAME

Filed July 18, 1966

INVENTORS
E.D. BRANDT
D.D. VARNER
BY A. C. Schwarz, Jr.
ATTORNEY

United States Patent Office 3,354,260
Patented Nov. 21, 1967

3,354,260

THROUGH-CONNECTORS FOR CIRCUIT BOARDS AND METHOD OF APPLYING SAME

Edmund D. Brandt, Chicago, and Dennis D. Varner, Wauconda, Ill., assignors to Western Electric Company, Incorporated, New York, N.Y., a corporation of New York Filed July 18, 1966, Ser. No. 566,095
3 Claims. (Cl. 174—68.5)

The present invention relates to through-connectors for circuit boards and more particularly to improved through-connectors for a circuit board which may expand and contract slightly during the normal use thereof, and to a method of attaching the through-connectors to the circuit boards.

In certain types of circuit boards having electrically conductive circuit elements on opposite sides of the dielectric board and having apertures passing through the board and aligned portions of opposed circuit elements, through-connectors are inserted into the apertures and the protruding opposite ends of the through-connectors are soldered to the opposed circuit elements, respectively, to establish electrical connections therebetween. Because of dimensional changes in the dielectric boards in response to changing environmental conditions, such as humidity and temperature, a flexible through-connector is provided to permit slight expansion and contraction of the circuit board and relative movement of the opposed circuit elements without impairing the electrical connections between the latter.

However, during the soldering of the ends of the flexible through-connector to the opposed circuit elements, molten solder may flow into the aperture in the dielectric circuit board, and in many of such cases the solder causes the through-connector to change its condition from one of flexibility to one of rigidity. Hence, as a result of the rigid condition of such through-connector and of the expansion and contraction of the dielectric board in response to variation in the environmental temperature and moisture, many of such connections are subjected to considerable stress and rupture as a consequence thereof and result in defective circuit connections.

To prevent the solder from entering the apertures and thus overcome this problem, improved composite through-connectors have been devised which are disclosed in copending application of J. A. Burns and G. W. Eftang, Serial No. 322,607, filed November 12, 1963, now Patent No. 3,268,652, issued on August 23, 1966. One embodiment of the through-connector has a braided wire sleeve encircling a rubber core, the normal diameter of the wire sleeve and core being larger than the diameter of the aperture in the dielectric board. It is necessary therefore, to compress this through-connector radially to a diameter smaller than that of the aperture in the circuit board, in order to insert it into the aperture and allow the rubber core to expand therein with the braided wire sleeve and fill up and close the aperture in the board and thus prevent the solder in its molten state from entering the aperture. However great difficulty has been experienced in inserting such normally oversized composite through-connectors into the apertures in circuit boards.

Accordingly, objects of the present invention are to provide improved through-connectors for apertured circuit boards of the type that are subject to dimensional changes in response to changing environmental conditions, and a method of attaching the through-connectors to such apertured circuit boards.

Another object of the invention is to provide a flexible composite through-connector of a size which may be inserted readily into an aperture of an apertured circuit board and subsequently expanded to fill up and close the aperture and prevent the solder in a fluid state from entering therein and thereby insure flexibility of the intermediate portion of the through-connector after the end portions thereof have been soldered to circuit elements on opposite sides of the board.

A further object of the invention is to provide a tubular, flexible, expandable and contractible, electrically conductive through-connector of a size readily insertible into an aperture of a circuit board and having a plastic core capable of being expanded by the application of heat thereto after insertion of the through-connector into such aperture, to fill up and close the latter.

Other objects, advantages and novel aspects of the invention will become apparent upon consideration of the following detailed description, in conjunction with the accompanying drawings, in which.

Figures 1, 2, 3, 4:
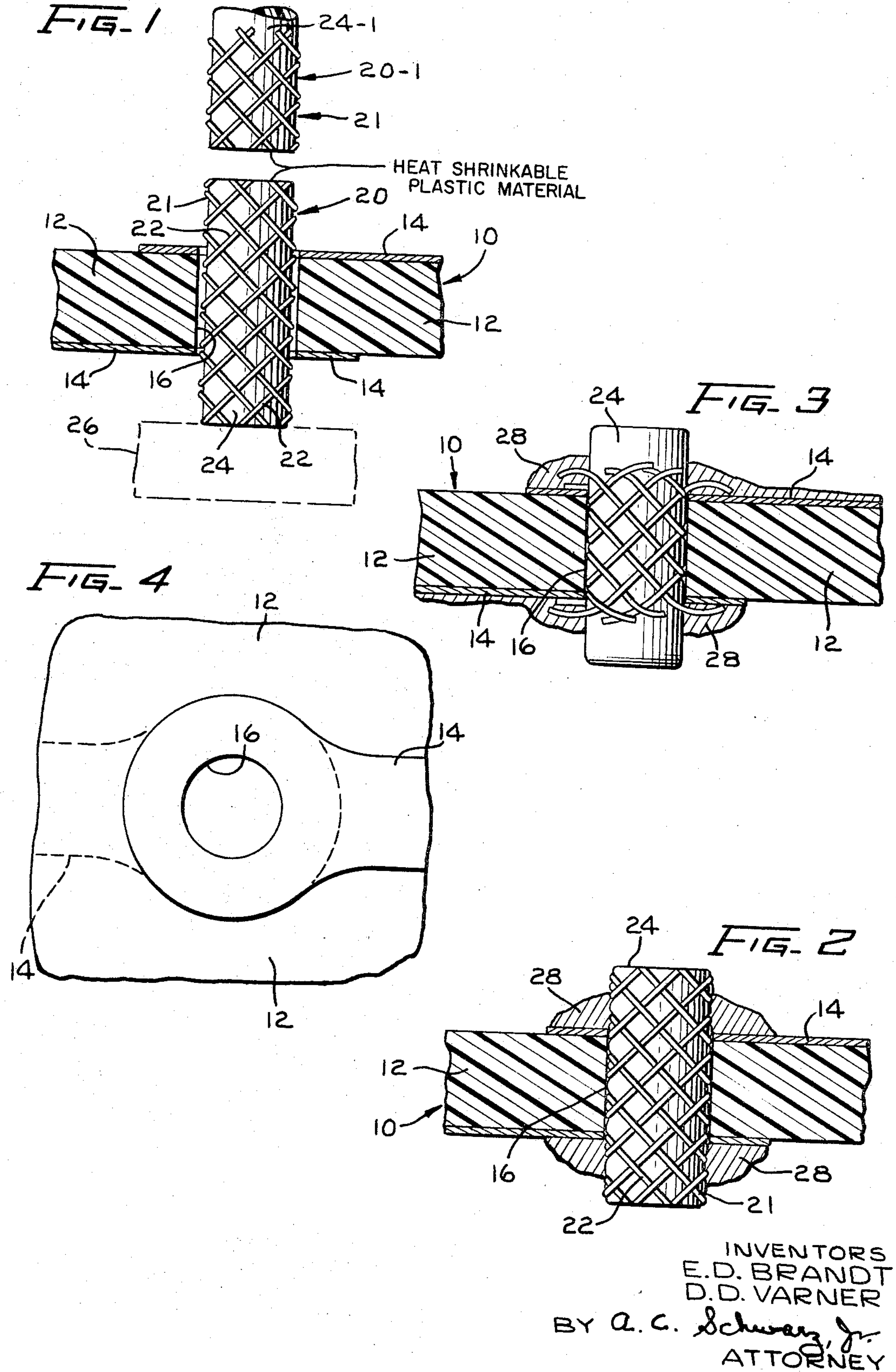
FIG. 1 is a fragmentary view showing a flexible expandable through-connector severed from a supply strand thereof and positioned in an aperture of a circuit board.
FIG. 2 is a view of the through-connector in the circuit board after the connector core has been expanded laterally to fill the aperture and the ends of the through-connector have been solder connected to circuit elements on opposite sides of the board.
FIG. 3 is a view similar to FIG. 2 showing the end portions of the wire sleeve of the through-connector bent laterally and solder connected to the opposed circuit elements.
FIG. 4 is a fragmentary plan view of the portion of a circuit board having an aperture therethrough and circuit elements on opposite sides of the board surrounding the aperture and extending therefrom.

Referring to the drawings, a portion of a circuit board 10 is shown which comprises a dielectric panel 12 having metallic circuit elements 14, 14 formed on opposite sides thereof with portions of the circuit elements 14 in overlying and opposed relation to each other. An aperture 16 extending through the board 12 and the circuit elements 14 permits the insertion of a through-connector therethrough to the opposed portions of the circuit elements to electrically interconnect the latter. Circuit boards made of dielectric material are subject to dimensional changes in response to changing environmental conditions such as humidity and temperature.

A composite through-connector 20 embodying the present invention for use on circuit boards which may expand and contract, comprises a flexible sleeve 21 of braided wire 22 encircling a plastic dielectric core 24 which is capable of being expanded laterally in response to the application of heat thereto. The composite through-connector 20 is formed as part of an elongated supply strand 20–1 thereof and successive through-connectors are severed from the strand as needed. The core 24 is made of plastic, dielectric material such as polyolefin, or polyethylene, capable of being treated and changed from a dimensionally heat stable normal shape to a dimensionally heat unstable second shape, and subsequently returned to the dimensionally heat stable normal shape in response to the application of heat thereto.

To make the composite through-connector strand 20–1, a strand 24–1 of the selected dielectric core material and of a diameter as large as or slightly larger than the diameter of the aperture 16, is irradiated, heated, or otherwise suitably treated and is then stretched longitudinally from its heat stable form to its heat unstable form and to reduce the diameter thereof to a predetermined size which is less than the diameter of the aperture 16. The core strand 24–1 is then allowed to set or freeze in its elongated and heat unstable condition at room temperature. Thereafter the wires 22 are braided into a sleeve around the dielectric core 24 to form the composite strand 20–1 having an outside diameter less than the diameter of the aperture 16.

After severance from the supply strand, the through-connector 20 is inserted into the aperture 16 of the circuit board 10 and is suitably supported therein. Each wire 22 serves as an electrical conductor which is arranged sinuously or helically and longitudinally of the through-connector and is capable of being extended and contracted longitudinally of the core. The through-connector 20 may be supported on a heating element 26 indicated diagrammatically in FIG. 1 in properly oriented relation to the circuit board with the end portions of the through-connector extending equidistant from opposite sides of the circuit board.

The electrical heating element 26 is then energized to cause the heating of the core 24 and thereby effect the lateral expansion of the core to its heat stable normal shape. During this expansion the core serves to expand the wire sleeve, and portions of the plastic core move into the openings between the braided wires 22 into engagement with the inner surface of the aperture 16 and thus fill up and close the aperture of the circuit board. In this condition the plastic core serves to anchor the composite through-connector 20 to the circuit board and in cooperation with the walls of the aperture to enclose and protect the intermediate portion of the braided wire sleeve 21.

At the projecting end portions of the composite through-connector, portions of the expanded plastic core 24 are disposed between the wires of the braided wire sleeve but do not close around them. Thus portions of the wires 21 at the projecting end portions of the sleeve remain uncovered and accessible for the engagement of molten solder therewith and the soldering of the end portion of the wire sleeve to the circuit elements 14.

Molten solder is applied to the projecting end portions of the through-connectors 20 and to the circuit elements 14 and form solid rings of solder 28 which are bonded to the circuit elements 14 and to the wire sleeve and cooperate with the latter to establish an elecrical connection between the opposed circuit elements 14, 14. The expanded core 24 within the aperture 16 serves to keep the solder when molten from flowing into the aperture and becoming bonded to and solidifying the intermediate portion of the braided wire sleeve. Thus the intermediate portion of the braided wire sleeve remains flexible and cooperates with the flexible dielectric core to permit expansion and contraction of the dielectric board 12 in response to changes in temperature and humidity in the environment of the board, without impairing the electrical connection between the opposed circuit elements 14, 14.

In another embodiment of the invention the opposite ends of the wire sleeve are flared out and bent against or in close proximity to the end portion of the circuit elements 14 as shown in FIG. 3. The through-connector 20 after being inserted into the aperture 16 of the circuit board may rest on a lower tool and below an upper tool, which tools are movable toward each other and have end surfaces shaped to spread the ends of the wire sleeve and press them against the circuit elements. The core 12 is compressed longitudinally during this movement of the tools but returns longitudinally to its original position when the tools are removed from the core.

Heat is then applied to the core to effect the lateral expansion thereof and the filling and closing of the aperture 16 thereby without adversely affecting the circuit elements 14. Thereafter molten solder is applied to the ends of the through-connector and solidifies into solder rings 28 which are bonded to the conductor 14 and to the end portions of the wire sleeve 22 and cooperate with the latter to electrically interconnect the opposed circuit elements 14 of the circuit board.

From the foregoing description it will be apparent that the through-connector may be readily inserted in an aperture in a circuit board, and the core thereof readily expanded by the application of heat thereto to cause the core to fill up and effectively close the aperture and thus preclude the possibility of the solder when molten from entering therein and solidifying the braided wire sleeve during the soldering of the through-connector to the circuit elements.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. A composite electrical through-connector of the type described comprising:
   a single elongated plastic member of solid cross section constructed from heat-shrinkable material, said material having been changed from a dimensionally heat stable form to a dimensionally heat unstable form, said plastic member having a reduced cross section in the heat unstable form and being further characterized by being capable of being returned to its dimensionally heat stable form and expanded in cross section in response to the application of heat thereto; and
   an elongated flexible electrical conductor supported on said plastic member around and longitudinally thereof and capable of being expanded and contracted longitudinally of said member.

2. A composite electrical through-connector of the type described comprising:
   a solid elongated plastic member of a material that is capable of being changed from a dimensionally heat stable form to a dimensionally heat unstable form of reduced cross section and of being returned to its dimensionally heat stable form and expanded in cross section in response to the application of heat thereto; and
   an elongated electrically conductive flexible braided wire sleeve supported on said plastic member around and longitudinally thereof.

3. A method of forming an electrical connection between a pair of circuit elements on opposite sides of a dielectric board with portions of the circuit elements disposed adjacent to an aperture through the board, comprising the steps of:
   longitudinally inserting, through the aperture, an electrical through-connector which comprises a single, elongated plastic member of solid cross section constructed from heat shrinkable material, said material having been changed from a dimensionally heat-stable form of expanded cross section capable of forming a tight fit with the aperture to a dimensionally heat-unstable form having a cross-section smaller than the aperture, said material being further characterized by being returned to its dimensionally heat-stable form and expanded in cross-section in response to the application of heat, said member further supporting on its periphery an elongated flexible electrical conductor capable of being expanded and contracted longitudinally of said member, the end portions of the conductor and the member projecting from opposite sides of the board;
   heating the member to cause it to expand and fill up and close the aperture in the board and in cooperation with said board to enclose and protect the intermediate portion of said conductor; and
   bonding the ends of the conductor to the respective circuit elements.

References Cited

UNITED STATES PATENTS

| | | | |
|---|---|---|---|
| 3,037,068 | 5/1962 | Wessel | 174—69 |
| 3,022,482 | 2/1962 | Waterfield et al. | |
| 3,243,211 | 3/1966 | Wetmore | 174—84 X |
| 3,268,652 | 8/1966 | Burns et al. | 174—68.5 |

DARREL L. CLAY, *Primary Examiner.*